United States Patent
Oh et al.

(10) Patent No.: US 8,395,955 B2
(45) Date of Patent: Mar. 12, 2013

(54) SEMICONDUCTOR MEMORY INTERFACE DEVICE WITH A NOISE CANCELLATION CIRCUIT HAVING A PHASE AND GAIN ADJUSTMENT CIRCUITRY

(75) Inventors: Tae-Young Oh, Seoul (KR); Seung-Jun Bae, Hwaseong-si (KR); Kwnag-Il Park, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 216 days.

(21) Appl. No.: 12/948,193

(22) Filed: Nov. 17, 2010

(65) Prior Publication Data
US 2011/0158011 A1  Jun. 30, 2011

(30) Foreign Application Priority Data
Dec. 29, 2009  (KR) .......................... 10-2009-0132764

(51) Int. Cl.
*G11C 7/02*  (2006.01)
(52) U.S. Cl. .......... 365/206; 365/194; 365/198; 365/51; 365/63; 365/233.5
(58) Field of Classification Search .................. 365/194, 365/198, 191, 206, 51, 72, 63, 233.5
See application file for complete search history.

(56) References Cited

U.S. PATENT DOCUMENTS

| | | | | |
|---|---|---|---|---|
| 5,285,119 | A * | 2/1994 | Takahashi | 326/57 |
| 6,437,633 | B2 * | 8/2002 | Muellner | 327/478 |
| 6,862,246 | B2 | 3/2005 | Funaba et al. | |
| 2011/0126039 | A1 * | 5/2011 | Kim et al. | 713/501 |

FOREIGN PATENT DOCUMENTS

| KR | 1020010073174 | 7/2001 |
|---|---|---|
| KR | 1020090041461 | 4/2009 |

* cited by examiner

*Primary Examiner* — Andrew Q Tran
(74) *Attorney, Agent, or Firm* — F. Chau & Associates, LLC

(57) ABSTRACT

A memory interface circuit is provided, comprising: a first signal output circuit configured to output a first signal via a first signal line to a first I/O terminal; a second signal output circuit configured to output a second signal via a second signal line to a second I/O terminal; and a noise cancellation circuit having at least one phase adjusting element and at least one gain adjusting element to reduce a noise signal induced on the second signal line due to the presence of the first signal on the first signal line, wherein the second signal line is disposed adjacent to the first signal line.

16 Claims, 10 Drawing Sheets

SEMICONDUCTOR MEMORY INTERFACE DEVICE WITH A NOISE CANCELLATION CIRCUIT HAVING A PHASE AND GAIN ADJUSTMENT CIRCUITRY

CROSS-REFERENCE TO RELATED APPLICATIONS

This application claims priority under 35 USC §119 to Patent Application No. 2009-0132764 filed on Dec. 29, 2009 with the Korean Intellectual Property Office (KIPO), the contents of which are herein incorporated by reference in their entirety.

BACKGROUND

1. Technical Field

Example embodiments relate to semiconductor devices; in particular, a memory interface device and method with noise reduction.

2. Discussion of the Related Art

As operating speed of semiconductor devices increases, coupled with higher rate of integration of semiconductor devices, signal lines for transferring signals internally or between semiconductor devices are disposed near one another. Accordingly, when a signal is transmitted through one signal line, noise such as crosstalk noise or coupling noise may be induced in other nearby signal lines.

SUMMARY

According to an aspect of the present inventive concept, a memory interface circuit is provided, comprising: a first signal output circuit configured to output a first signal via a first signal line to a first I/O terminal; a second signal output circuit configured to output a second signal via a second signal line to a second I/O terminal; and a noise cancellation circuit having at least one phase adjusting element and at least one gain adjusting element to reduce a noise signal induced on the second signal line due to the presence of the first signal on the first signal line, wherein the second signal line is disposed adjacent to the first signal line.

According to another aspect, a third signal output circuit is configured to output a third signal via a third signal line to a third I/O terminal, wherein the output of the noise cancellation circuit is also used to reduce noise due to the presence of the first signal on the first signal line.

According to another aspect, a delay unit is connected to the first signal line configured to adjust the phase of the first signal.

According to another aspect, the noise cancellation circuit includes more than one phase adjusting element and more than one gain adjusting element, wherein each of the more than one phase adjusting elements and gain adjusting elements is independently adjustable.

A memory system is also provided, comprising: a first semiconductor device that interfaces with a second semiconductor device via respective I/O terminals, the first semiconductor device comprising: a first signal output circuit configured to output a first signal via a first signal line to a first I/O terminal; a second signal output circuit configured to output a second signal via a second signal line to a second I/O terminal; and a first noise cancellation circuit having at least one phase adjusting element and at least one gain adjusting element to reduce a noise signal induced on the second signal line due to the presence of the first signal on the first signal line; and a second semiconductor device comprising: a third signal output circuit configured to output a third signal via a third signal line to a third I/O terminal; a fourth signal output circuit configured to output a fourth signal via a fourth signal line to a fourth I/O terminal; and a second noise cancellation circuit having at least one phase adjusting element and at least one gain adjusting element to cancel a noise signal induced on the fourth signal line due to the presence of the third signal on the third signal line.

According to another aspect, the second signal line is disposed adjacent to the first signal line, and a third signal line is disposed adjacent to the fourth signal line.

According to another aspect, the first semiconductor device is a memory controller, and the second semiconductor device is a memory device.

According to another aspect, the first noise cancellation circuit includes more than one phase adjusting element and more than one gain adjusting element.

According to another aspect, the output of the first noise cancellation circuit is applied to a plurality of signal lines, and the output of the second noise cancellation circuit is applied to a plurality of signal lines.

According to another aspect, the first semiconductor device includes more than one noise cancellation circuits, and the second semiconductor device includes more than one noise cancellation circuits.

A memory interface method is also provided, comprising: detecting a noise signal at a second signal line induced from a signal on a first signal line disposed adjacent to the second signal line; measuring the phase and magnitude of the noise signal; adjusting delay and gain values of a noise cancellation circuit based on the measured phase and magnitude of the noise signal to output a noise reduction signal; and applying the noise reduction signal to the second signal line to reduce the noise signal present at the second signal line.

According to another aspect, the method further includes applying the noise reduction signal to a third signal line.

A method of noise reduction training in a memory device is also provided, comprising: transmitting a signal through a first signal line; measuring characteristics of a noise signal generated on a second signal line; generating a noise reduction signal by adjusting the phase of the measured noise signal; repeating the measuring and generating steps until the noise level is within a predetermined level; and applying the noise reduction signal to the second signal line.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
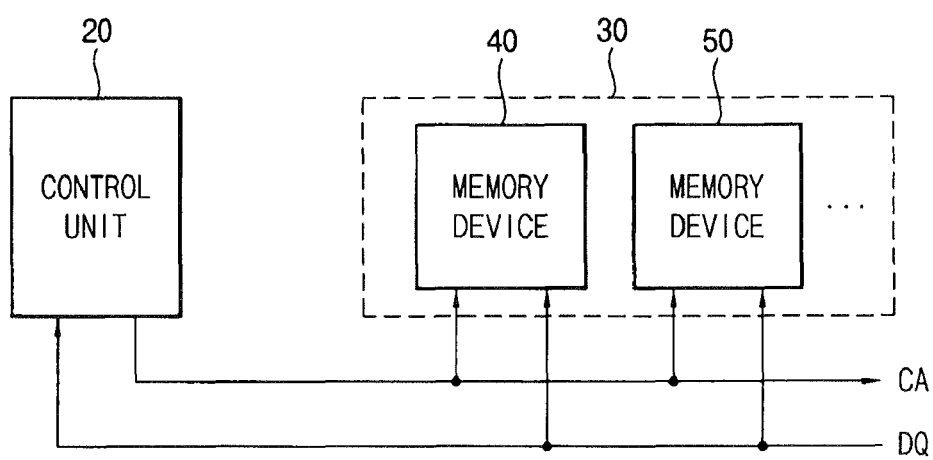
FIG. 1 is a block diagram illustrating a memory system according to some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 is a block diagram illustrating a memory system according to some example embodiments.

Referring to FIG. 1, a memory system 10 includes a control unit 20 and a memory module 30 which has a plurality of memory devices 40 and 50. The control unit 20 exchanges data DQ with each of the memory devices 40 and 50, and the control unit 20 applies a command/address signal CA to each of memory devices 40 and 50. The control unit 20 may be one of a memory controller, a micro processor, a central processing unit (CPU) and a graphic processing unit (GPU). Each of the memory devices 40 and 50 may be a memory device for storing data such as DRAM, RRAM, MRAM, PRAM, a graphic memory and a flash memory.

Figure 2:
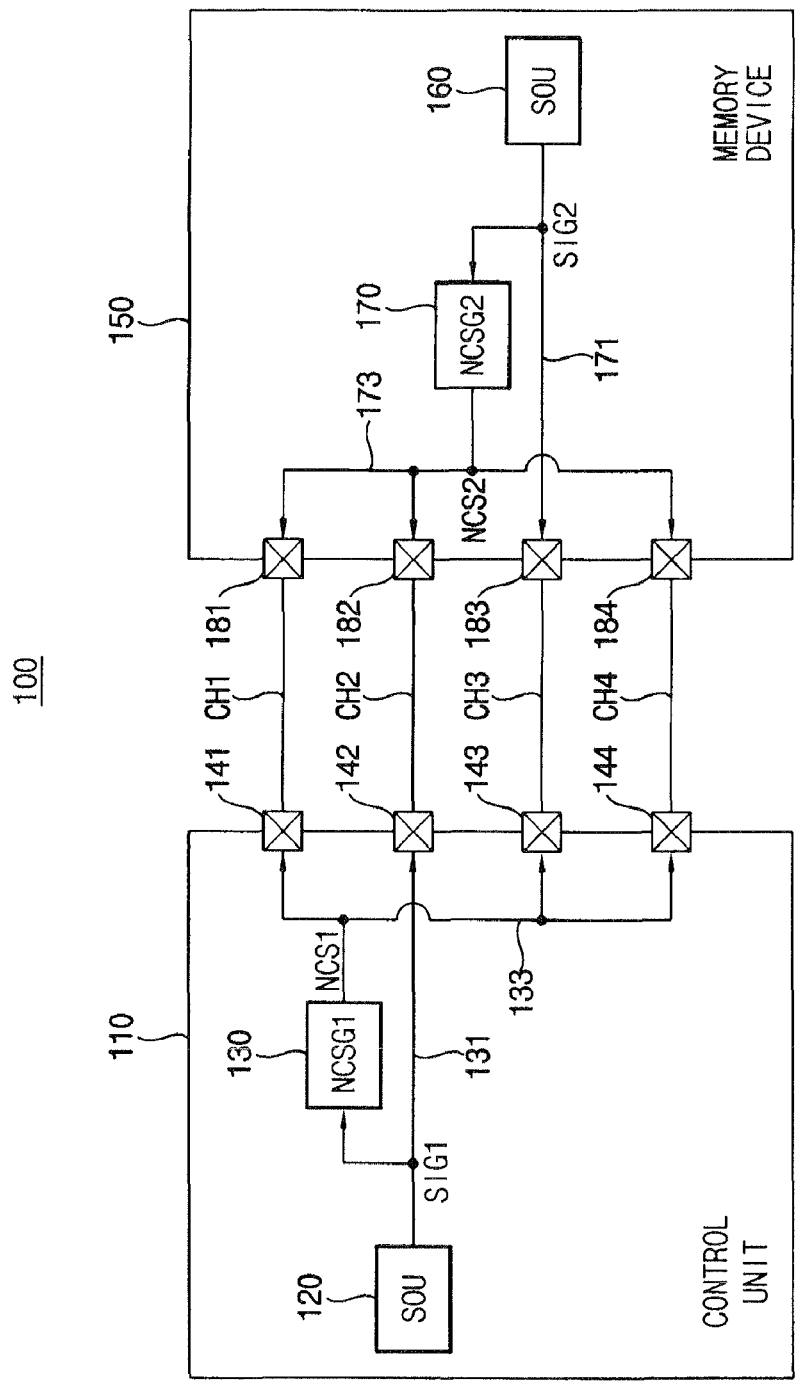
FIG. 2 is a block diagram illustrating a memory system according to some example embodiments.

FIG. 2 is a block diagram illustrating a memory system according to some example embodiments.

Referring to FIG. 2, a memory system 100 includes a first semiconductor device 110 and a second semiconductor device 150. The first semiconductor device 110 may be a control unit and the second semiconductor device 150 may be a memory device. An interface unit transmits/receives signals between the control unit 110 and the memory device 150.

Each of input/output (I/O) terminals 141~144 of the control unit 110 is connected to each of I/O terminals 181~184 of the memory device 150 through each of channels CH1~CH4. Each of the channels CH1~CH4 may be a transmission line.

The control unit 110 includes a signal output circuit 120 and a noise cancelling signal generator 130. The signal output circuit 120 provides a signal SIG1 to the I/O terminal 142 through a first signal line 131. The memory device 150 also includes a signal output circuit 160 and a noise cancelling signal generator 170. The signal output circuit 160 provides a signal SIG2 to the I/O terminal 183 through a second signal line 171. In some embodiments, the signal output circuit 120 may be one of a data signal output circuit, a command signal output circuit and an address signal output circuit. In addition, the first signal line 131 may be one of a data signal line, a command signal line and an address signal line. The signal output circuit 160 may be a data signal output circuit.

When the signal SIG1 is transmitted to the I/O terminal 142 through the first signal line 131, a noise (a crosstalk noise or a coupling noise) due to the signal SIG1 in the first signal line 131 may be induced in signal lines (not illustrated) connected to the I/O terminals 141, 143 and 144 adjacent to the I/O terminal 142. The noise in signal lines (not illustrated) connected to the I/O terminals 141, 143 and 144 adjacent to the I/O terminal 142 may be induced when a transition of the signal SIG1 in the first signal line 131 occurs. In some instances, such induced noise interrupts the transition of the signal SIG1 in the first signal line 131 when the signal SIG1 transitions from a logic low level to a logic high level or transitions from a logic high level to a logic low level.

The noise cancelling signal generator 130 detects the transition of the signal SIG1 transmitted through the first signal line 131, generates a noise cancelling signal NCS1 for cancelling the noise in signal lines (not illustrated) connected to the I/O terminals 141, 143 and 144 adjacent to the I/O terminal 142, and applies the noise cancelling signal NCS1 to the adjacent signal lines or the I/O terminals 141, 143 and 144 through a signal line 133. Therefore, signals are transmitted with the noise due to the signal SIG1 being minimized in the channels CH1~CH4.

Similarly, the noise cancelling signal generator 160 in the memory device 150 detects a transition of the signal SIG2 transmitted through the second signal line SIG2, generates a noise cancelling signal NCS2 for cancelling the noise in signal lines (not illustrated) connected to the I/O terminals 181, 183 and 184 adjacent to the I/O terminal 182, and applies the noise cancelling signal NCS2 to the adjacent signal lines or the I/O terminals 181, 183 and 184 through a signal line 173. Therefore, signals are transmitted with the noise due to the signal SIG2 being minimized in the channels CH1~CH4.

Although the signal output circuits 120 and 160 are shown as connected to I/O terminals 142 and 183 as illustrated in FIG. 2, other signal output circuits may be respectively connected to each of I/O terminals 141, 143, 144, 181, 182 and 184. In addition, corresponding noise cancelling signal generator may be connected to each of other signal output circuits which are not illustrated. In addition, the noise cancelling signal NCS1 is not applied to the first signal line 131, because the noise cancelling signal NCS1 is for cancelling the noise induced in other signal lines connected to the I/O terminals 141, 143 and 144 adjacent to the I/O terminal 142. Similarly, the noise cancelling signal NCS2 is not applied to the second signal line 171, because the noise cancelling signal NCS2 is for cancelling the noise induced in other signal lines connected to the I/O terminals 181, 182 and 184 adjacent to the I/O terminal 183.

Figure 3:
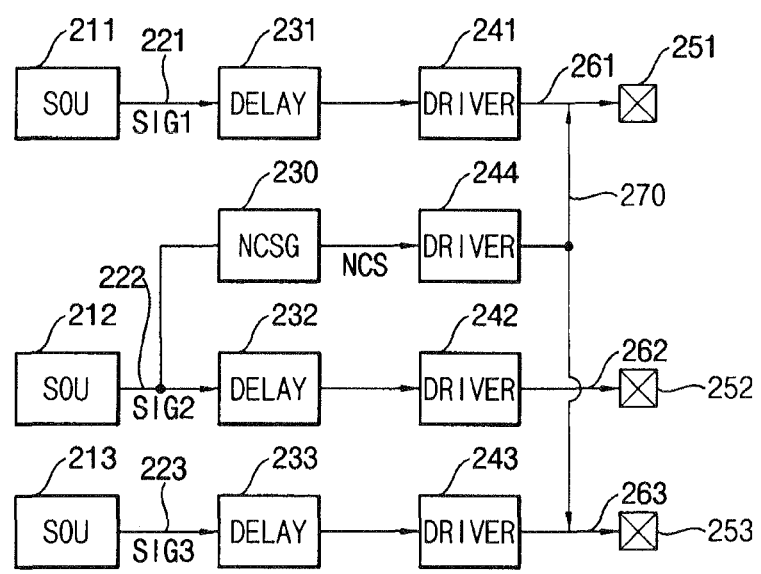
FIG. 3 is a block diagram of a signal output circuit and a noise cancelling signal generator connected in a memory device.

FIG. 3 is a block diagram of a signal output circuit and a noise cancelling signal generator connected in a memory device. Referring to FIG. 3, a semiconductor device 200 includes a plurality of signal output circuits 211~213 and a noise cancelling signal generator 230. Each of the signal output circuits 211~213 is connected to each of I/O terminals 251~253 through signal lines 221 and 261, 222 and 262 and 223 and 263, and each of the signal output circuits 211~213 outputs each of signals SIG1~SIG3. In some embodiments, each of the signal lines 221 and 261, 222 and 262 and 223 and 263 may be one of a data signal line, a command signal line and an address signal line. Each of the signal output circuits 211~213 may be connected to each of the I/O terminals 251~253 via respective delay units 231~233 and drivers 241~243. Each of the delay units 231~233 may be included for synchronizing each first time when each of signals SIG1~SIG3 is applied to each of the signal lines 261~263 or the I/O terminals 251~253 with a second time when a noise cancelling signal NCS generated from the noise cancelling signal generator 230 is applied to each of the signal lines 261~263 or the I/O terminals 251~253. The delay units 231~233 may have different delay times with respect to each other, the first time and the second time may be different.

Each of the drivers 241~243 may be an output driver commonly employed in a semiconductor device, and each of the drivers 241~243 amplifies an input signal and applies the amplified signal to a signal line connected to an I/O terminal. The noise cancelling signal generator 230 performs noise cancellation, for example, by detecting the signal SIG2 transmitted through the signal lines 222 and 263 from the signal output circuit 212 to the I/O terminal 252, and generating noise cancelling signal NCS. Such noise cancelling signal NCS is applied to the adjacent signal lines for cancelling the noise induced in these other signal lines (221 and 261 and 223 and 263) or the I/O terminals 251 and 253 through a signal line 270.

Figure 4:
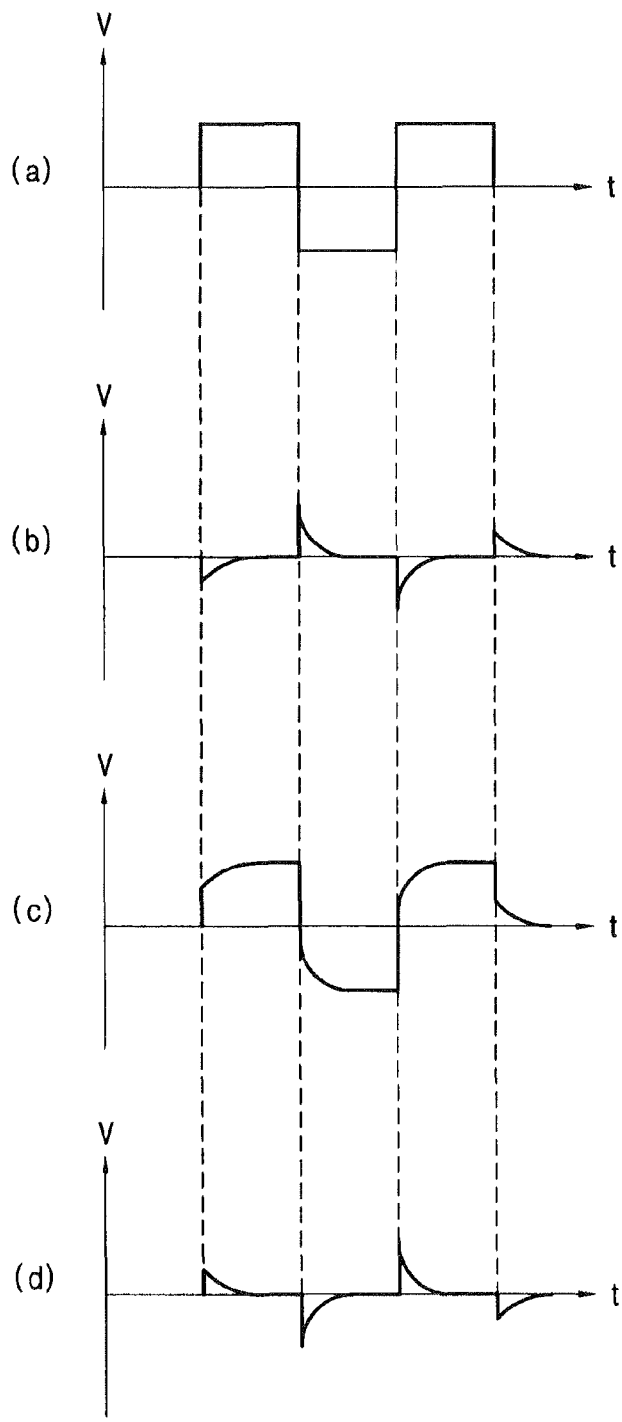
FIG. 4 is a waveform diagram illustrating various signals output from the circuits of FIG. 3.

FIG. 4 is a waveform diagram illustrating various signals output from the circuits of FIG. 3.

In FIG. 4, (a) illustrates a signal, from each of the signal output circuits 211~213, to be applied to each of the I/O terminals 251~253 without being influenced by the noise.

In FIG. 4, (b) illustrates a noise such as a coupling noise or a crosstalk noise which is induced in the signal lines 221 and 261 and 223 and 263 due to the signal SIG2 in the signal line 222 and 226.

In FIG. 4, (c) illustrates a signal, from each of the signals SIG1 and SIG2 in each of the signal lines 221 and 261 and 223 and 263, to be applied to each of the I/O terminals 251~253 as affected by noise due to the presence of signal SIG2 in the signal line 222 and 226. It is noted that when the signal in (a) is influenced by the noise in (b), the signal is distorted as shown in (c) and may be outputted through each of the I/O terminals 251~253. In some instances wherein the noise signal is severe, the distorted signal may be transmitted and received incorrectly.

In FIG. 4, (d) illustrates a noise cancelling signal NCS applied to the signal lines 261 and 263 after the noise cancelling signal NCS is amplified in the driver 244. When the noise cancelling signal NCS has a phase difference of about 180° with respect to the noise in (b), the noise may be entirely cancelled by the noise cancelling signal NCS. When the noise cancelling signal NCS in (d) is applied to the adjacent signal lines 261 and 263, the noise in (b) induced in the adjacent signal lines 261 and 263 may be cancelled. Therefore, the signal (a) may be outputted through each of the I/O terminals 251~253 without distortion from the noise.

Figure 5:
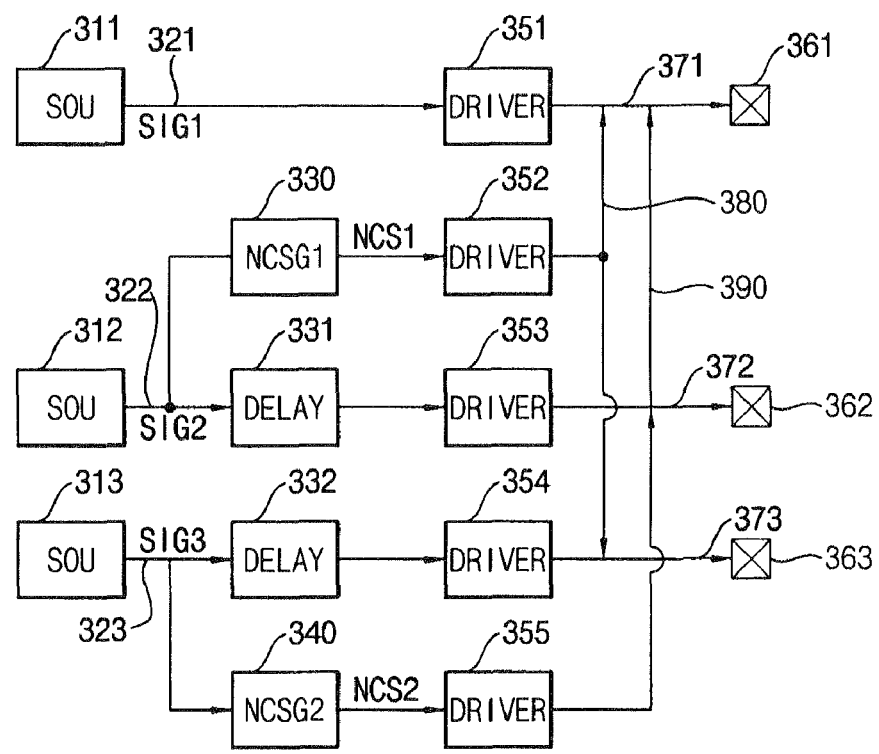
FIG. 5 is a block diagram of signal output circuits connected to a noise cancelling signal generator according to other example embodiments.

FIG. 5 is a block diagram of signal output circuits connected to a noise cancelling signal generator according to other example embodiments.

Referring to FIG. 5, a semiconductor device 300 includes a plurality of signal output circuits 311~313, noise cancelling signal generators 330 and 340. Each of the signal output circuits 231~313 outputs each of signals SIG1~SIG3, and each of the noise cancelling signal generators 330 and 340 generates each of noise cancelling signals NCS1 and NCS2. Each of the signal output circuits 311~313 is connected to each of I/O terminals 361~363 through respective signal lines 321 and 371, 322 and 372 and 323 and 373. The signal SIG1 is transferred to the I/O terminal 361 via the signal line 321, a driver 351 and the signal line 371. The signal SIG2 is transferred to the I/O terminal 362 via the signal line 322, a delay unit 331, a driver 353 and the signal line 372. The signal SIG3 is transferred to the I/O terminal 363 via the signal line 323, a delay unit 332, a driver 354 and the signal line 373.

The noise cancelling signal generator 330 generates the noise cancelling signal NCS1 for cancelling noises induced in other signal lines (321 and 371 and 323 and 373) due to the signal SIG2 in the signal lines 322 and 372 and applies the noise cancelling signal NCS1 to the adjacent signal lines (371 and 373) via the driver 352. The noise cancelling signal generator 340 generates the noise cancelling signal NCS2 for cancelling noises induced in other signal lines (322 and 372 and 322 and 372) due to the signal SIG3 and applies the noise cancelling signal NCS2 to the adjacent signal lines (372 and 371) via the driver 355.

The example embodiment of FIG. 5 is different from the example embodiment of FIG. 3 in that the example embodiment of FIG. 5 further includes the noise cancelling signal generator 340, and the signal SIG1 on the signal line 321 is directly applied to the driver 351 without passing through a delay unit. As shown in FIG. 5, the signal SIG1 on the signal line 321 is applied to the I/O terminal 361 without passing through a delay unit. As such, the signal SIG1 applied to the I/O terminal 361 may not be synchronized with a the signals SIG2 and SIG3 when they are applied to the I/O terminals 362 and 363. An additional delay unit may be placed in the signal line 321 for synchronization. In FIG. 5, the noise cancelling signal NCS1 for cancelling noises induced in other signal lines (321 and 371 and 323 and 373) due to the signal SIG2 in the signal lines 322 and 372 is applied to the adjacent signal lines (371 and 373), and the noise cancelling signal NCS2 for cancelling noises induced in other signal lines (322 and 372 and 322 and 372) due to the signal SIG3 is applied to the adjacent signal lines (372 and 371). Therefore, the noise cancelling signals NCS1 and NCS2 are applied to the signal line 371 to cancel the noise induced due to the adjacent signal lines.

Figure 6A:
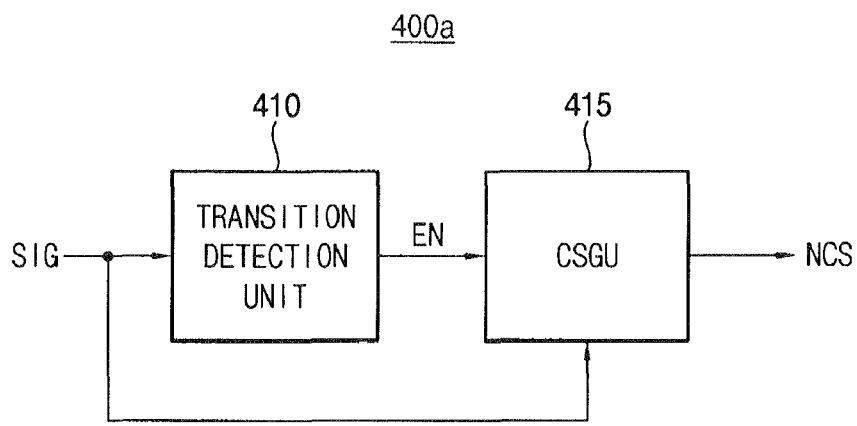
FIG. 6A is a block diagram illustrating a noise cancelling signal generator according to some example embodiments.
Figure 6B:
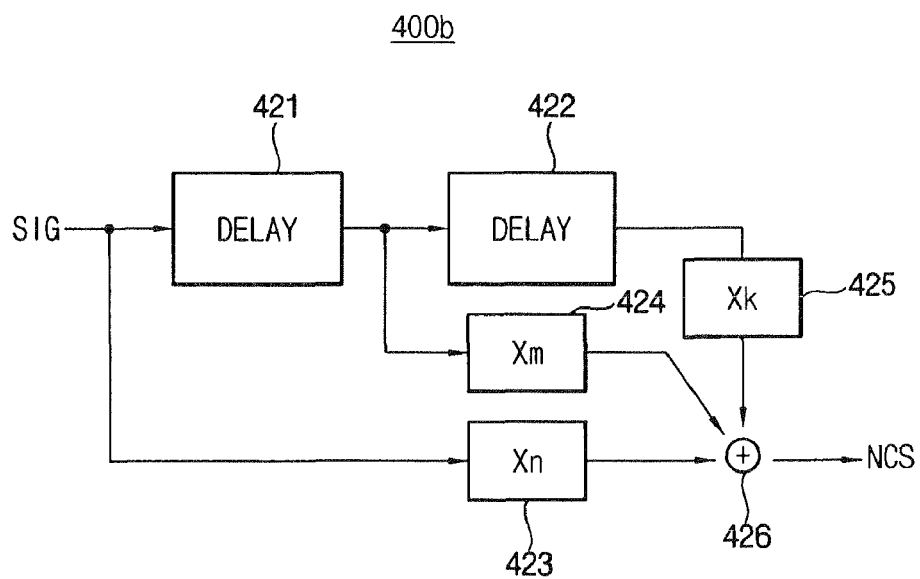
FIG. 6B is a block diagram illustrating a noise cancelling signal generator according to other example embodiments.

FIGS. 6A and 6B are block diagrams illustrating a noise cancelling signal generator according to some example embodiments. The noise cancelling signal generator may include a transition detection unit as illustrated in FIG. 6A, or the noise cancelling signal generator may filter the signal to generate the noise cancelling signal.

FIG. 6A is a block diagram of a noise cancelling signal generator according to some example embodiments.

Referring to FIG. 6A, a noise cancelling signal generator 400a includes a transition detection unit 410 and a cancelling signal generation unit 415. The transition detection unit 410 detects a transition of a signal SIG and provides an enable signal EN which is activated when the transition of the signal SIG occurs. According to some embodiments, the signal SIG is the SIG1 signal that appears on the signal lines 131, 221, and 321 in FIGS. 2, 3, and 5. The transition detection unit 410 provides the cancelling signal generation unit 415 with the enable signal EN which is activated when the signal SIG transitions from a logic high level to a logic low level or from a logic low level to a logic high level. The cancelling signal generation unit 415 is enabled by the enable signal EN to generate the noise cancelling signal NCS.

As described above and in connection with FIG. 4, when the signal SIG transitions, the noise such as crosstalk noise or coupling noise such as a signal shown in FIG. 4b is induced in the adjacent signal lines. The cancelling signal generation unit 415 generates a noise cancelling signal NCS that has a phase difference of about 180° with respect to the noise signal, as appears substantially as shown in FIG. 4d.

FIG. 6B is a block diagram illustrating a noise cancelling signal generator according to other example embodiments.

Referring to FIG. 6B, a noise cancelling signal generator 400b includes delay units 421, 422, amplifiers 423, 424 and 425 and a summer 426. The amplifier 423 has a gain (or coefficient) of n (n is a real number which is not zero), the amplifier 424 has a gain (or coefficient) of m (m is a real number which is not zero), and the amplifier 425 has a gain (or coefficient) of k (k is a real number which is not zero). The signal SIG is amplified by the amplifier 423, and is provided to the summer 426. The signal SIG is delayed by the delay unit 421, and then is amplified by the amplifier 424, and then is provided to the summer 426. As a further option, the signal SIG delayed by the delay unit 421 is further delayed by delay unit 422, and then is amplified by the amplifier 425, and then is provided to the summer 426. The summer 426 sums outputs of the amplifiers 423, 424 and 425 to provide the noise cancelling signal NCS. According to at least one embodiment, the noise cancelling signal NCS is provided to the signal lines except the signal line which carries the signal SIG1. Delay times of the delay units 421 and 422 and the gains (coefficients) of the amplifiers 423, 424 and 425 are adjustable, and thus, a magnitude and a phase of the noise cancelling signal SIG may be set as desired. According to another embodiment of the present inventive concept, the delay unit 422 and amplifier 425 may not be needed if adjustment of the delay unit 421 and amplifier 424 suffices to produce the noise cancelling signal NCS to cancel the noise signal to within a predetermined level.

Figure 7:
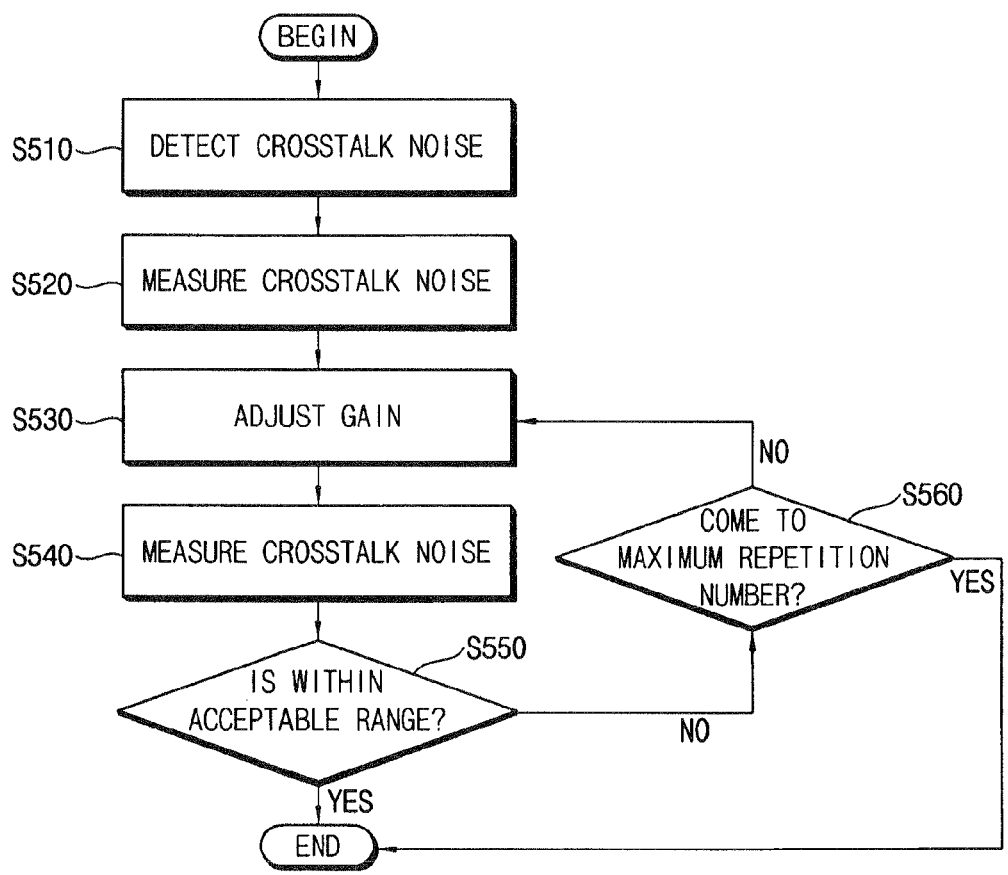
FIG. 7 is a flow chart illustrating a training method of a semiconductor memory device according to some example embodiments.

FIG. 7 is a flow chart illustrating a training method of a semiconductor memory device according to some example embodiments.

In a training method of a semiconductor memory device of FIG. 7, a noise such as crosstalk noise which is induced in signal lines is measured and gains (coefficients) of at least one amplifier or at least one delay unit included in the noise cancelling generator or gains (coefficients) of delay units connected to signal lines are adjusted such that the noise induced in adjacent signal lines may be minimized. Although in FIG. 7, the crosstalk noise is presented, the training method of FIG. 7 is applicable to a coupling or other noise as well.

Hereinafter, the training method of a semiconductor memory device will be explained with reference to FIGS. 2 through 7.

When the signal output circuit 212 outputs the signal SIG2 through the signal line 222, a crosstalk noise is generated in the signal lines 221 and 223 (S510). The crosstalk noise generated in the signal lines 221 and 223 is measured (S520). Coefficients (delay times) of the delay units 231, 232, 233 connected to the signal lines 221, 222 and 223 are adjusted or coefficients of the amplifiers 423, 424 and 425 and/or delay units 421 and 422 are adjusted (S530). Delay times of the delay units 231, 232, 233 are adjusted such that the induced crosstalk is minimized. The crosstalk noise induced in the signal lines 221 and 223 is measured (S540). If the measured noise value is not within an acceptable range (NO in S550), the adjustment, measurement, and test steps (S530, 5540, 5550) are repeated, until when a preset maximum repetition number is reached (S560). When the measured noise value is within an acceptable range (YES in S550), the training is completed.

Figure 8:
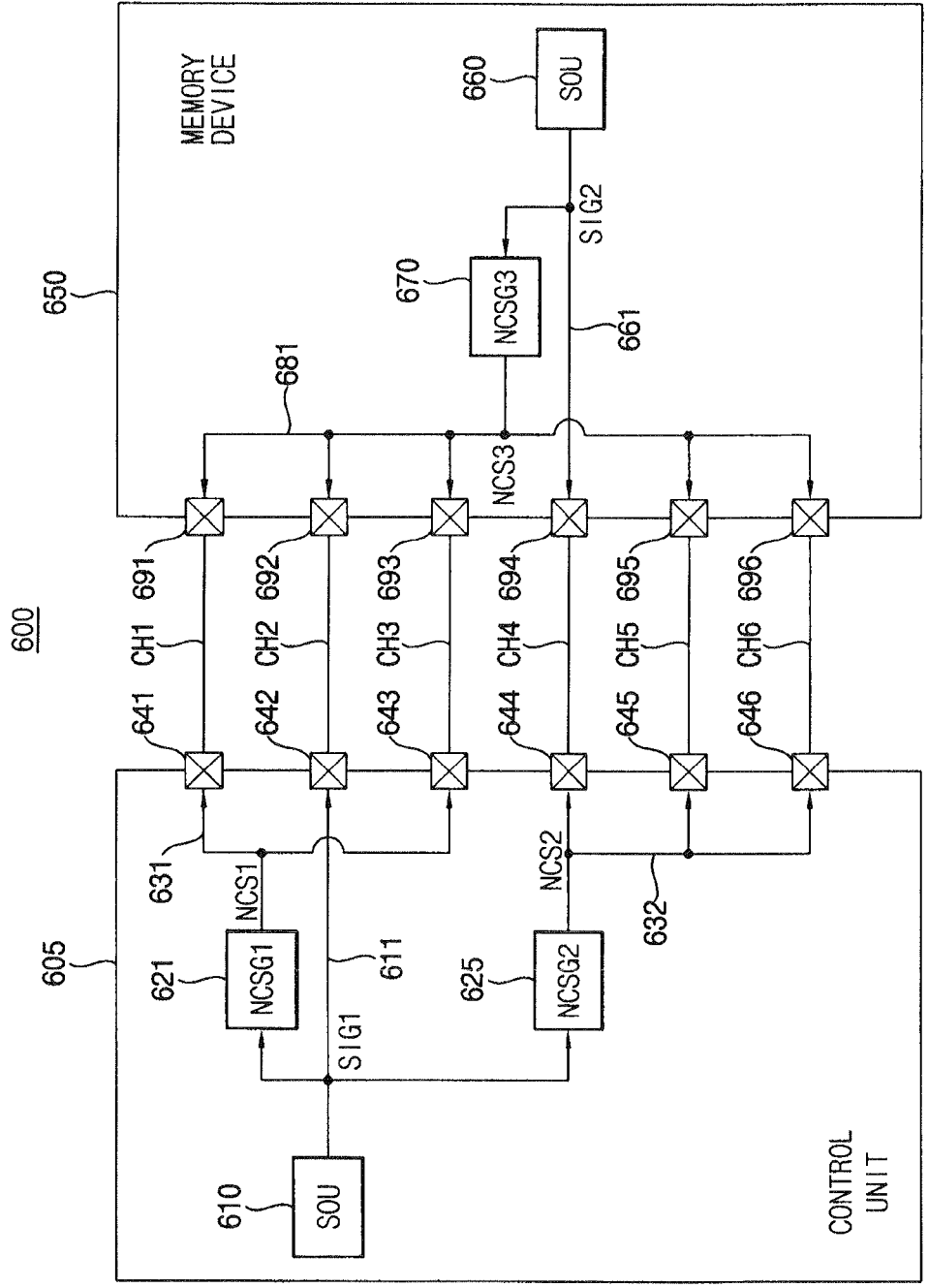
FIG. 8 illustrates a memory system having signal output circuits and noise cancelling signal generators according to some example embodiments.

FIG. 8 illustrates a memory system having signal output circuits and noise cancelling signal generators according to some example embodiments.

Referring to FIG. 8, a memory system 600 includes a control unit 605 and a memory device 650. The control unit 605 includes a signal output circuit 610 and noise cancelling signal generators 621 and 625, and the memory device 650 includes a signal output circuit 660 and a noise cancelling signal generator 670. The signal output circuit 610 outputs a signal SIG1 to be provided to I/O terminal 642 through a signal line 611. The signal output circuit 610 is connected to two noise cancelling signal generators 621 and 625.

The noise cancelling signal generator 621 applies a noise cancelling signal NCS1 for cancelling a noise induced due to the signal SIG1 to the I/O terminals 641 and 643 or to signal lines (not illustrated) connected to the I/O terminals 641 and 643 through a signal line 631. The noise cancelling signal generator 625 applies a noise cancelling signal NCS2 for cancelling a noise induced due to the signal SIG1 to the I/O terminals 644, 645 and 646 or to signal lines (not illustrated) connected to the I/O terminals 644, 645 and 646 through a signal line 632.

In FIG. 8, signal lines and signal output circuits can be connected to I/O terminals 691, 692, 693, 695, and 696 but are not illustrated for the sake of convenience. The signal output circuit 660 outputs a signal SIG2 to be provided to I/O terminal 694 through a signal line 661. The noise cancelling signal generator 670 applies a noise cancelling signal NCS3 for cancelling a noise induced due to the signal SIG3 to the I/O terminals 691, 692, 693, 695, and 696 or to signal lines (not illustrated) connected to the I/O terminals 691, 692, 693, 695, and 696 through a signal line 681. Each of the I/O terminals 641~646 of the control unit 605 is connected to the respective I/O terminals 691~696 of the memory device 650 through respective channels CH1~CH6.

In FIG. 8, two noise cancelling signal generators 621 and 625 respectively apply the noise cancelling signals NCS1 and NCS2 to respective corresponding signal lines according to intensity of the induced noise in the signal lines, because the intensity of the induced noise may be different according to a relative distance between the signal line 611 (noise source) and each of the adjacent signal lines (not illustrated).

Figure 9:
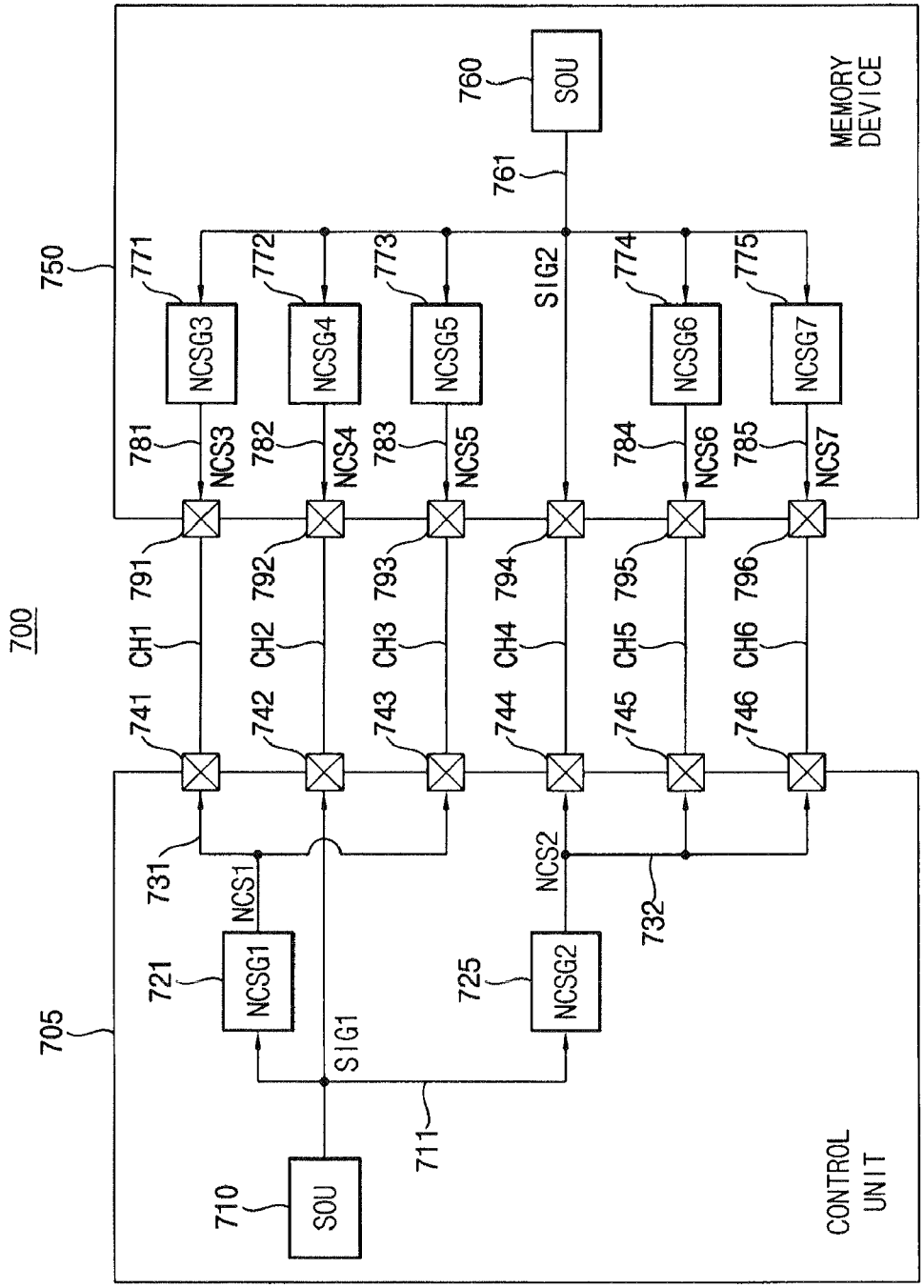
FIG. 9 illustrates another memory system having signal output circuits and noise cancelling signal generators according to other example embodiments.

FIG. 9 illustrates another memory system having signal output circuits and noise cancelling signal generators according to other example embodiments.

Referring to FIG. 9, a memory system 700 includes a control unit 705 and a memory device 750. The control unit 705 includes a signal output circuit 710 and noise cancelling signal generators 721 and 725, and the memory device 750 includes a signal output circuit 760 and noise cancelling signal generators 771~775. The signal output circuit 710 outputs a signal SIG1 to be provided to I/O terminal 742 through a signal line 711. In FIG. 9, signal lines and signal output circuits connected to I/O terminals 741, 743, 744, 745 and 746 are not illustrated for the sake of convenience.

The signal output circuit 710 is connected to two noise cancelling signal generators 721 and 725. The noise cancelling signal generator 721 applies a noise cancelling signal NCS1 for cancelling a noise induced due to the signal SIG1 to the I/O terminals 741 and 743 or to signal lines (not illustrated) connected to the I/O terminals 741 and 743 through a signal line 731. The noise cancelling signal generator 725 applies a noise cancelling signal NCS2 for cancelling a noise induced due to the signal SIG1 to the I/O terminals 744, 745 and 746 or to signal lines (not illustrated) connected to the I/O terminals 744, 745 and 746 through a signal line 732.

In FIG. 9, signal lines and signal output circuits connected to I/O terminals 791, 792, 793, 795, and 796 is not illustrated for the sake of convenience. The signal output circuit 760 outputs a signal SIG2 to be provided to I/O terminal 794 through a signal line 761. The signal output circuits 760 is connected to the noise cancelling signal generators 771~775. Each of the noise cancelling signal generators 771~775 applies each of noise cancelling signals NCS3~NCS7 for cancelling noise induced due to the signal SIG2 to each of the I/O terminals 791, 792, 793, 795, and 796 or to signal lines (not illustrated) connected to the I/O terminals 791, 792, 793, 795, and 796 through respective signal lines 781, 782, 783, 784 and 785. Each of the I/O terminals 741~746 of the control unit 705 is connected to the respective I/O terminals 791~796 of the memory device 750 through respective channels CH1~CH6.

In FIG. 9, the control unit 705 has a same configuration as the control unit 605 in FIG. 8, and the memory device 750 is different from the memory device 650 in FIG. 8 in that each of the noise cancelling signal generators 771~775 applies each of noise cancelling signals NCS3~NCS7 for cancelling noise that may be differently induced due to the signal SIG2 on each of the I/O terminals 791, 792, 793, 795, and 796. This is because intensity of the induced noise may be different according to a relative distance between the signal line 761 (noise source) and each of the signal lines 781, 782, 783, 784 and 785.

Figure 10:
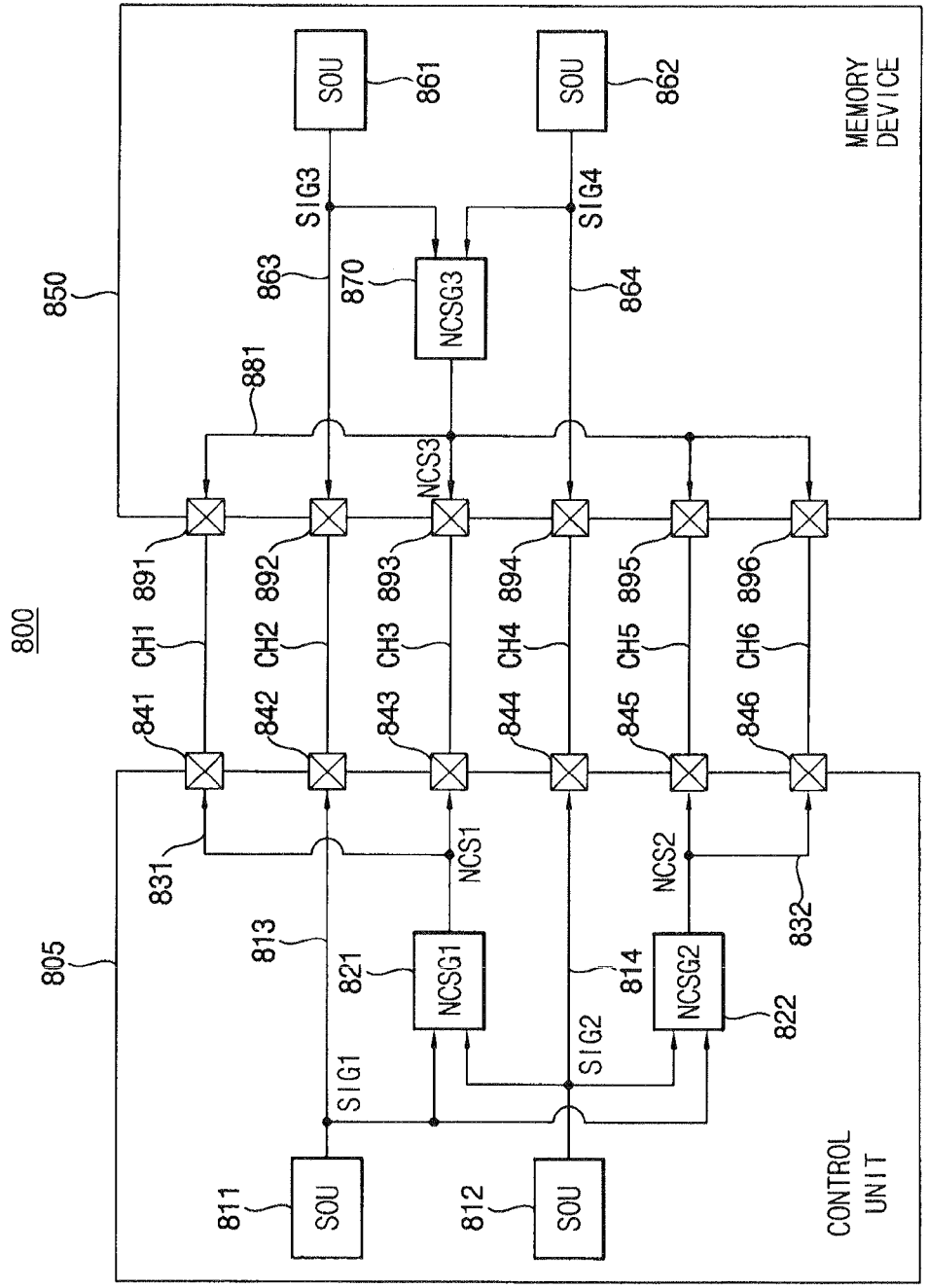
FIG. 10 illustrates still another memory system having signal output circuits and noise cancelling signal generators.

FIG. 10 illustrates still another memory system having signal output circuits and noise cancelling signal generators.

Referring to FIG. 10, a memory system 800 includes a control unit 805 and a memory device 850. The control unit 805 includes a signal output circuit 810 and noise cancelling signal generators 821 and 823, and the memory device 850 includes signal output circuits 861 and 862 and a noise cancelling signal generator 870. The signal output circuit 811 outputs a signal SIG1 to be provided to I/O terminal 842 through a signal line 813. The signal output circuit 812 outputs a signal SIG2 to be provided to I/O terminal 844 through a signal line 814. In FIG. 10, signal lines and signal output circuits connected to I/O terminals 841, 843, 84 and 846 are not illustrated for the sake of convenience.

The signal output circuit 811 is connected to two noise cancelling signal generators 821 and 822. In addition, the signal output circuit 812 is connected to two noise cancelling signal generators 821 and 822. The noise cancelling signal generator 821 applies a noise cancelling signal NCS1 for cancelling a noise induced due to the signal SIG1 in the signal line 813 and a noise induced due to the signal SIG2 in the signal line 814 to the I/O terminals 841 and 843 or to signal lines (not illustrated) connected to the I/O terminals 841 and 843 through a signal line 831. The noise cancelling signal generator 822 applies a noise cancelling signal NCS2 for cancelling a noise induced due to the signal SIG1 in the signal line 813 and a noise induced due to the signal SIG2 in the signal line 814 to the I/O terminals 845 and 845 or to signal lines (not illustrated) connected to the I/O terminals 845 and 846 through a signal line 832.

The signal output circuit 861 in the memory device 850 outputs a signal SIG3 to be provided to I/O terminal 892 through a signal line 863. The signal output circuit 862 in the memory device 850 outputs a signal SIG4 to be provided to I/O terminal 894 through a signal line 864. In FIG. 10, signal lines and signal output circuits connected to I/O terminals 891, 893, 895, and 896 is not illustrated for the sake of convenience. The signal output circuits 861 and 862 are connected to the noise cancelling signal generator 870. The noise cancelling signal generator 870 applies a noise cancelling signal NCS3 for cancelling a noise induced due to the signal SIG3 in the signal line 863 and due to the signal SIG4 in the signal line 864 to the I/O terminals 891, 893, 895 and 896 or to signal lines (not illustrated) connected to the I/O terminals 891, 893, 895 and 896 through a signal line 881. Each of the I/O terminals 841~846 of the control unit 805 is connected to the respective I/O terminals 891~896 of the memory device 850 through respective channels CH1~CH6.

In FIG. 10, the control unit (or interface) 805 includes the signal output circuits 811 and 813, and each of the signal output circuits 811 and 813 is connected to the respective noise cancelling signal generators 821 and 822. The noise cancelling signal generator 821 generates and applies the noise cancelling signal NCS1 for cancelling the noise induced in the adjacent signal lines due to the signal SIG1 to the I/O terminals 841 and 843 or to signal lines (not illustrated) connected to the I/O terminals 841 and 843. The noise cancelling signal generator 822 generates and applies the noise cancelling signal NCS2 for cancelling the noise induced in the adjacent signal line due to the signal SIG2 to the I/O terminals 845 and 846.

In FIG. 10, the memory device (or interface) 850 includes the noise cancelling signal generator 870 which generates the noise cancelling signal NCS3 to the adjacent signal lines such that an influence due to the noise may be canceled or reduced.

As illustrated in FIGS. 8, 9 and 10, configuration and connection relationship of the control unit and the memory device in the semiconductor device may be varied according to various example embodiments.

As mentioned above, when a signal is transmitted via one signal line, noise induced in other signal lines due to the transmitted signal may be cancelled by a noise cancelling signal, and thus, signal distortion may be prevented. Therefore, noise characteristics and signal integrity may be enhanced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A memory interface circuit, comprising:
a first signal output circuit configured to output a first signal via a first signal line to a first I/O terminal;
a second signal output circuit configured to output a second signal via a second signal line to a second I/O terminal; and
a noise cancellation circuit having at least one phase adjusting element and at least one gain adjusting element to reduce a noise signal induced on the second signal line due to the presence of the first signal on the first signal line.

2. The memory interface circuit according to claim 1, wherein the second signal line is disposed adjacent to the first signal line.

3. The memory interface circuit according to claim 1, further including a third signal output circuit configured to output a third signal via a third signal line to a third I/O terminal, wherein the output of the noise cancellation circuit is also used to reduce noise due to the presence of the first signal on the first signal line.

4. The memory interface circuit according to claim 1, further including a delay unit connected to the first signal line configured to adjust the phase of the first signal.

5. The memory interface circuit according to claim 1, wherein the noise cancellation circuit includes more than one phase adjusting element and more than one gain adjusting element.

6. The memory interface circuit according to claim 5, wherein each of the more than one phase adjusting elements and gain adjusting elements is independently adjustable.

7. A memory system, comprising:
   a first semiconductor device that interfaces with a second semiconductor device via respective I/O terminals, the first semiconductor device comprising:
   a first signal output circuit configured to output a first signal via a first signal line to a first I/O terminal;
   a second signal output circuit configured to output a second signal via a second signal line to a second I/O terminal; and
   a first noise cancellation circuit having at least one phase adjusting element and at least one gain adjusting element to reduce a noise signal induced on the second signal line due to the presence of the first signal on the first signal line; and
   a second semiconductor device comprising:
   a third signal output circuit configured to output a third signal via a third signal line to a third I/O terminal;
   a fourth signal output circuit configured to output a fourth signal via a fourth signal line to a fourth I/O terminal; and
   a second noise cancellation circuit having at least one phase adjusting element and at least one gain adjusting element to cancel a noise signal induced on the fourth signal line due to the presence of the third signal on the third signal line.

8. The memory system according to claim 7, wherein the second signal line is disposed adjacent to the first signal line.

9. The memory system according to claim 7, wherein the third signal line is disposed adjacent to the fourth signal line.

10. The memory system according to claim 7, wherein the first semiconductor device is a memory controller.

11. The memory system according to claim 7, wherein the second semiconductor device is a memory device.

12. The memory system according to claim 7, wherein the first noise cancellation circuit includes more than one phase adjusting element and more than one gain adjusting element.

13. The memory system according to claim 7, wherein the output of the first noise cancellation circuit is applied to a plurality of signal lines in the memory controller.

14. The memory system according to claim 7, wherein the output of the second noise cancellation circuit is applied to a plurality of signal lines in the memory device.

15. The memory system according to claim 7, wherein the first semiconductor device includes more than one noise cancellation circuits.

16. The memory system according to claim 7, wherein the second semiconductor device includes more than one noise cancellation circuits.

* * * * *